(12) United States Patent
Anderson et al.

(10) Patent No.: US 12,349,458 B2
(45) Date of Patent: Jul. 1, 2025

(54) STAGGERED STACKED CIRCUITS WITH INCREASED EFFECTIVE WIDTH

(71) Applicant: INTERNATIONAL BUSINESS MACHINES CORPORATION, Armonk, NY (US)

(72) Inventors: Brent A Anderson, Jericho, VT (US); Junli Wang, Slingerlands, NY (US); Albert Chu, Nashua, NH (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 587 days.

(21) Appl. No.: 17/701,015

(22) Filed: Mar. 22, 2022

(65) Prior Publication Data

US 2023/0307453 A1    Sep. 28, 2023

(51) Int. Cl.
| | | |
|---|---|---|
| *H10D 84/85* | (2025.01) | |
| *H10D 62/10* | (2025.01) | |
| *H10D 62/17* | (2025.01) | |
| *H10D 84/01* | (2025.01) | |
| H10D 84/03 | (2025.01) | |

(52) U.S. Cl.
CPC ......... *H10D 84/856* (2025.01); *H10D 62/118* (2025.01); *H10D 62/221* (2025.01); *H10D 84/0165* (2025.01); *H10D 84/85* (2025.01); H10D 84/0186 (2025.01); H10D 84/038 (2025.01)

(58) Field of Classification Search
CPC .. H10D 84/85; H10D 84/856; H10D 84/0167; H10D 84/0186
See application file for complete search history.

(56) References Cited

U.S. PATENT DOCUMENTS

| | | | |
|---|---|---|---|
| 9,472,551 B2 | 10/2016 | Oxland | |
| 2020/0006356 A1* | 1/2020 | Ando | B82Y 10/00 |

(Continued)

FOREIGN PATENT DOCUMENTS

WO    2021003427 A1    1/2021

OTHER PUBLICATIONS

B. Kumar, P. Mittal, S. Saxena, B. K. Kaushik, Y. S. Negi and G. D. Varma, "Analytical modeling and staggered-planar structural analysis for organic field effect transistor," 2012 IEEE International Conference on Signal Processing, Computing and Control, 2012, pp. 1-6.

*Primary Examiner* — Davienne N Monbleau
*Assistant Examiner* — Emily Nicole Farmer
(74) *Attorney, Agent, or Firm* — Tutunjian & Bitetto, P.C.; Erik Johnson (57) ABSTRACT

A semiconductor structure including a first logic cell having a first plurality of nanosheet devices along an axis and a second logic cell having a second plurality of nanosheet devices along the axis. Nanosheets of the second plurality of nanosheet devices are wider than nanosheets of the first plurality of nanosheet devices. The first logic cell is a same type as the second logic cell. The first and second logic cells can include inverter circuits or NAND circuits or NOR circuits. When the first logic cell has a height X, a width Y, and an effective width ($W_{eff}$) Z, then the second logic cell has a height 2X, a width Y, and $W_{eff} > 2.5$ Z.

20 Claims, 5 Drawing Sheets

(56) References Cited

U.S. PATENT DOCUMENTS

| | | |
|---|---|---|
| 2020/0075574 A1 | 3/2020 | Smith et al. |
| 2020/0168715 A1* | 5/2020 | Wu ................... H01L 21/30604 |
| 2020/0381430 A1 | 12/2020 | Liebmann et al. |
| 2021/0028169 A1 | 1/2021 | Smith et al. |
| 2021/0098627 A1 | 4/2021 | Liaw |
| 2021/0233909 A1* | 7/2021 | Bao ................... H10D 30/6743 |
| 2021/0366906 A1* | 11/2021 | Huang ................ H01L 23/5286 |
| 2022/0093613 A1* | 3/2022 | Moriwaki .......... H10D 30/6735 |

* cited by examiner

STAGGERED STACKED CIRCUITS WITH INCREASED EFFECTIVE WIDTH

BACKGROUND

The present invention relates generally to semiconductor fabrication techniques, and more specifically, to staggered stacked circuits with increased effective width.

The semiconductor integrated circuit (IC) industry has experienced rapid growth. In the course of the IC evolution, functional density (i.e., the number of interconnected devices per chip area) has generally increased while geometry size (i.e., the smallest component (e.g., line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

SUMMARY

In accordance with an embodiment, a semiconductor structure is provided. The semiconductor structure includes a first logic cell having a first plurality of nanosheet devices along an axis and a second logic cell having a second plurality of nanosheet devices along the axis, where nanosheets of the second plurality of nanosheet devices are wider than nanosheets of the first plurality of nano sheet devices and when the first logic cell has a height X, a width Y, and an effective width ($W_{eff}$) Z, then the second logic cell has a height 2X, a width Y, and $W_{eff} > 2.5$ Z.

In accordance with another embodiment, a semiconductor structure is provided. The semiconductor structure includes a first logic cell having a first plurality of nanosheet devices along a first axis and a second axis, wherein the first and second axes are substantially parallel to each other and a second logic cell having a second plurality of nanosheet devices along the first axis, where nanosheets of the second plurality of nanosheet devices are wider than nanosheets of the first plurality of nano sheet devices and when the first logic cell has a height X, a width Y, and an effective width ($W_{eff}$) Z, then the second logic cell has a height 2X, a width Y, and $W_{eff} > 2.5$ Z.

In accordance with yet another embodiment, a method for constructing a semiconductor structure is provided. The method includes constructing a first nanosheet device with narrow and wide nanosheets, forming a dielectric isolation layer, constructing a second nanosheet device with narrow and wide nanosheets, forming middle-of-line (MOL) components to the first and second nanosheet devices, forming back-end-of-line (BEOL) components, flipping and bonding to a carrier wafer, exposing a backside and forming contacts to the source/drain regions, and forming a backside power delivery network.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention present a staggered stacked device with two circuits of the same type with at least a first circuit utilizing narrow device width and at least a second circuit utilizing wide device width. The active device area on the narrow device circuit does not overlap between levels. In contrast, however, the active device area on the wide device circuit does overlap between levels.

A field effect transistor (FET) device is a semiconductor device that controls the electrical conductivity between a source of electric current (source) and a destination of the electrical current (drain). The FET uses a semiconductor structure called a "gate" to create an electric field, which controls the shape and consequently the electrical conductivity of a channel between the source and the drain. The channel is a charge carrier pathway constructed using a semiconductor material.

A nanosheet FET transistor usually includes a substrate, an isolation layer, a number of vertically stacked nanosheets forming a channel and a gate. A nanosheet is formed of a thin layer of semiconductor channel material having a vertical thickness that is less than a width of the material.

Another example of a semiconductor device is a nanosheet FET transistor device. Known nanosheet FET transistor devices include a substrate, an isolation layer, a number of vertically stacked nanosheets forming a channel and a gate. A nanosheet is formed of a thin layer of semiconductor channel material having a vertical thickness that is less than a width of the material.

Another example of a semiconductor device is a fin-type field effect transistor (FinFET) device. Known FinFET devices include fins with source/drain regions on lateral sides of the fins, so that current flows in a horizontal direction (e.g., parallel to a substrate) between source/drain regions at opposite ends of the fins in the horizontal direction.

Another example of a semiconductor device is a vertical field effect transistor (VFET) (also referred to as vertical transport field effect transistors (VTFETs)) device. VFET devices include fin channels with source/drain regions at ends of the fin channels on top and bottom sides of the fins. Current flows through the fin channels in a vertical direction (e.g., perpendicular to a substrate), for example, from a bottom source/drain region to a top source/drain region.

A logic gate is a device that acts as a building block for digital circuits. Logic gates perform basic logical functions that are fundamental to digital circuits. In a circuit, logic gates make decisions based on a combination of digital signals coming from its inputs. Most logic gates have two inputs and one output. Logic gates are based on Boolean algebra. At any given moment, every terminal is in one of the two binary conditions, that is, false or true. False represents 0, and true represents 1. Depending on the type of logic gate being used and the combination of inputs, the binary output will differ. Logic gates are commonly used in integrated circuits (IC).

Flash memory is often used in embedded systems as a means to store data and information, providing the system with the needed instructions to operate. Two of the most widely used types of flash memory include NOR and NAND flash.

Flash memory is a non-volatile memory storage device that can be electrically erased and reprogrammed. Non-volatile memory means that the memory device will retain the stored data even when the system is powered off. One of the reasons that flash memory is often used in embedded systems is its ability to erase data in blocks rather than by individual bytes. Because flash memory needs to be erased before it can be programmed, this helps expedite the process and allows for faster programming. There are several different types of flash memory, but the most commonly used include NOR and NAND flash. Both of these types of flash memory store data in memory cells made from floating gate transistors.

NOR flash is optimized for random access capabilities, which means it is capable of accessing data in any order and does not require following a sequence of storage locations. In its internal circuit configuration, each of NOR flash's memory cells are connected in parallel, that is, one end of the memory cell is connected to the source line and the other end is connected to the bit line. Because of this, the system is able to access individual memory cells.

NAND flash, on the other hand, is optimized for high-density data storage and gives up the ability for random access capabilities. Unlike NOR flash, NAND flash cells are connected, usually eight memory transistors at time, in a series to the bit line called a string. Here, the source of one cell is connected to the drain of the next one. This series connection reduces the number of ground wires and bit lines, and as a result of this configuration, NAND has a smaller cell size. This does not however allow for direct access to individual cells.

The exemplary embodiments of the present invention introduce methods and structures that improve the performance of transistors that can be used in various electronic applications, from ultra-scaled digital circuits to 5G communications. The exemplary embodiments in accordance with the present invention present a staggered stacked device with two circuits of the same type with at least a first circuit utilizing narrow device width and at least a second circuit utilizing wide device width. The active device area on the narrow device circuit does not overlap between levels. In contrast, however, the active device area on the wide device circuit does overlap between levels.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
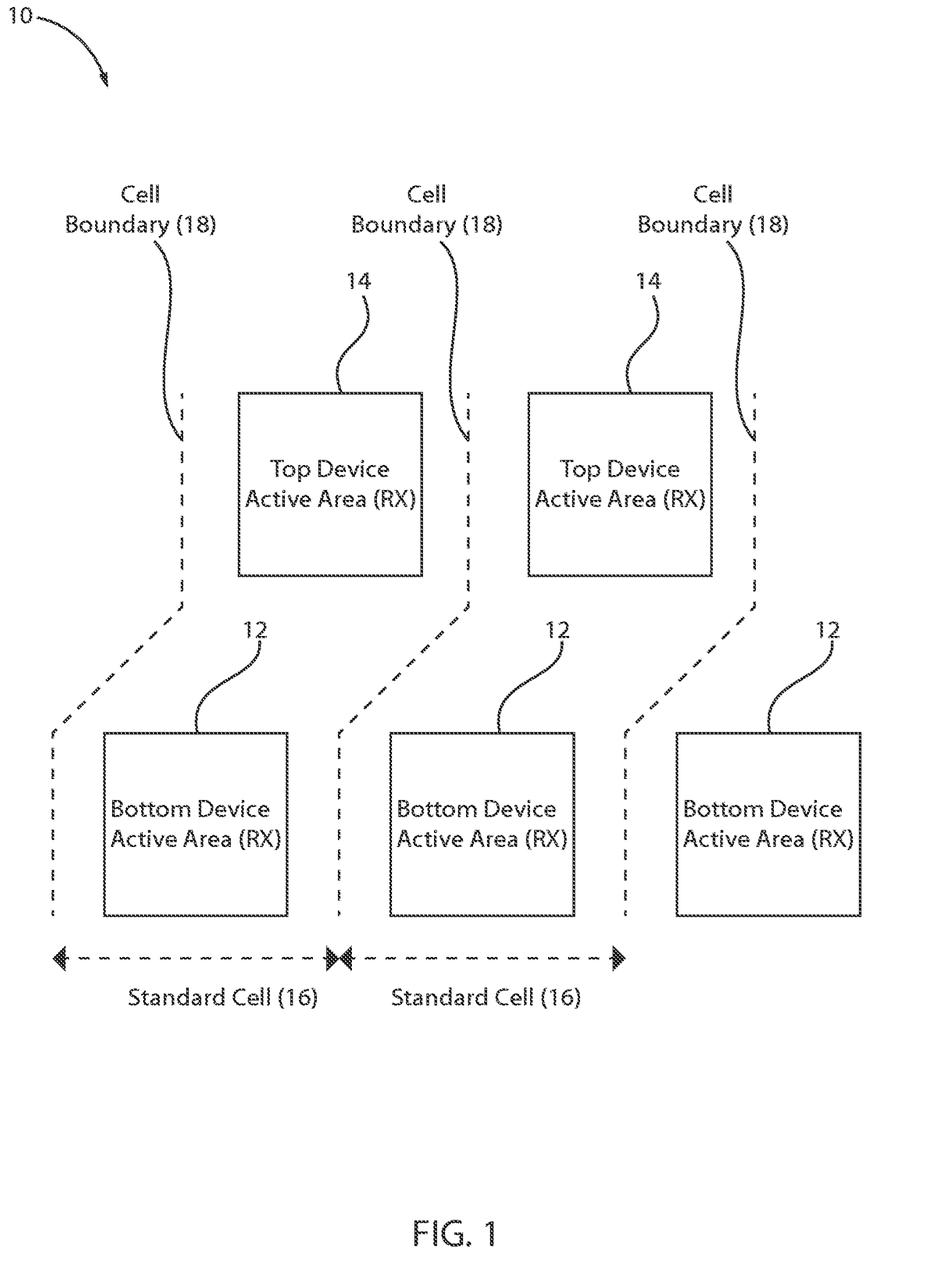
FIG. 1 is a block/flow diagram of a semiconductor structure having vertical staggered stacked devices, in accordance with an embodiment of the present invention.

FIG. 1 is a block/flow diagram of a semiconductor structure having vertical staggered stacked devices, in accordance with an embodiment of the present invention.

FIG. 1 shows vertical stacked structure 10 having a top semiconductor device with top active areas 14 in a staggered configuration relative to a bottom semiconductor device with respective bottom active areas 12. In this type of configuration, the cell boundary 18 of the standard cell 16 for the active areas 14 of the top device is not aligned with the cell boundary 18 of the standard cell 16 of the respective active areas 12 of the bottom device. This staggered configuration will improve the contact landing and local interconnects without occurring any area penalty.

Figure 2:
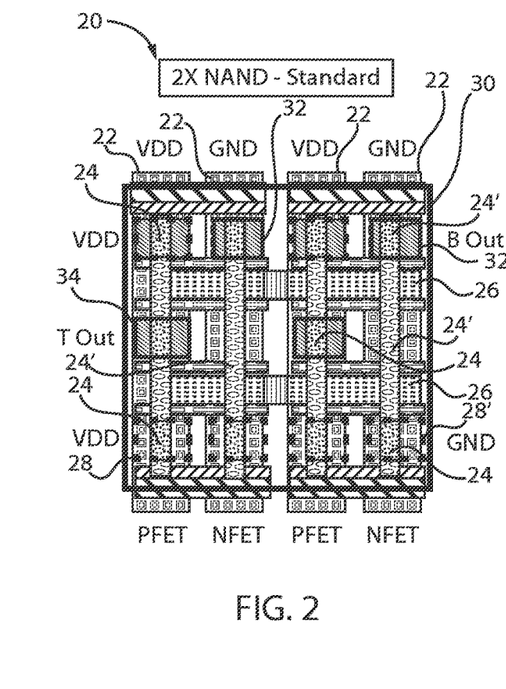
FIG. 2 is a top view of a standard 2X NAND circuit illustrating NFET and PFET nanosheets stacks, in accordance with an embodiment of the present invention.

FIG. 2 is a top view of a standard 2X NAND circuit illustrating NFET and PFET nanosheets stacks, in accordance with an embodiment of the present invention.

A standard NAND circuit 20 includes a substrate 22 for forming NFET stacks and PFET stacks thereon. The NFET and PFET stacks are forming in an alternating manner. The PFET stacks are designated as 24 and the NFET stacks are designated as 24'. Source/drain contacts 28, 28' can be formed to the PFET stacks 24 and the NFET stacks 24', respectively. The source/drain contacts 28, 28' can be better visualized with reference to FIG. 5. A gate 26 can also be formed over the PFET stacks 24 and the NFET stacks 24'.

The logic cell 30 includes the circuit 20, which further illustrates a backside output 32 and a front side output 34. The backside output 32 or $B_{OUT}$ is designated on the NFET stacks 24', whereas the front side output 34 or $T_{OUT}$ is designated on the PFET stacks 24.

In the top view, the PFET stacks 24 are viewed as extending vertically from top to bottom, and similarly, the NFET stacks 24' are viewed as extending vertically from top to bottom. The PFET stacks 24 do not overlap with the NFET stacks 24', and vice versa. In other words, the PFET stacks 24 are vertically offset from the NFET stacks 24'.

Figure 3:
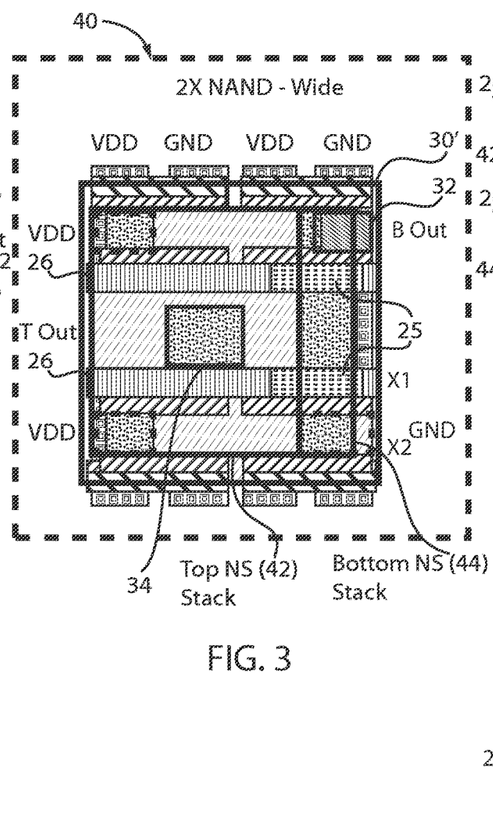
FIG. 3 is a top view of an exemplary 2X NAND circuit with wide sheets illustrating NFET and PFET nanosheets stacks, in accordance with an embodiment of the present invention.

FIG. 3 is a top view of an exemplary 2X NAND circuit 40 with wide sheets illustrating NFET and PFET nanosheets stacks, in accordance with an embodiment of the present invention.

In contrast to FIG. 2, in FIG. 3 the PFET stacks and the NFET stacks have wide nanosheets. The PFET stack is designated as 42 and the NFET stack is designated as 44. The PFET stack 42 can also be referred to as a top nanosheet (NS) stack and the NFET stack 44 can also be referred to as a bottom NS stack. Cross-sections along lines X1 and X2 better illustrate the top NS stack 42 and the bottom NS stack 44, as well as the overlapping relationship between the two, as further shown in FIGS. 4 and 5. The logic cell 30' including the circuit 40 also illustrates a gate contact 25.

The top NS stack 42 extends over the bottom NS stack 44, as better illustrated with reference to FIGS. 4 and 5 below.

Figure 4:
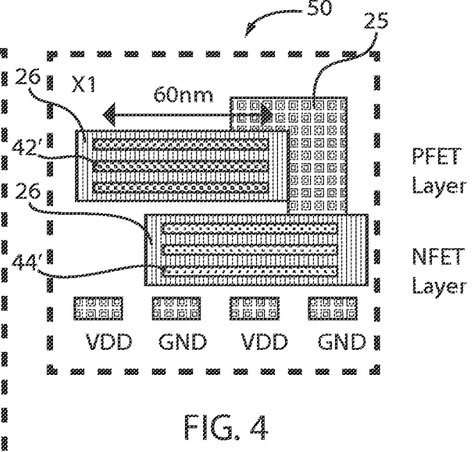
FIG. 4 is a cross-sectional view through a gate region of the NAND circuit with wide sheets of FIG. 3, in accordance with an embodiment of the present invention.
Figure 5:
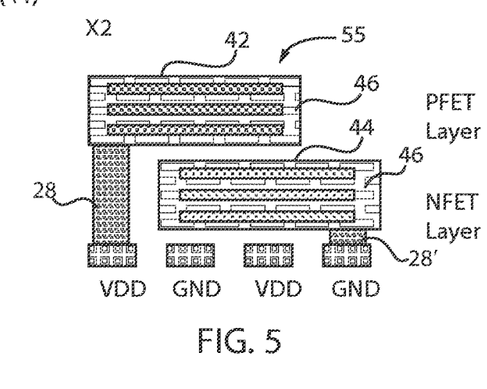
FIG. 5 a cross-sectional view through a source/drain region of the NAND circuit with wide sheets of FIG. 3, in accordance with an embodiment of the present invention.

FIG. 4 is a cross-sectional view 50 through a gate region of the NAND circuit with wide sheets of FIG. 3, in accordance with an embodiment of the present invention and FIG. 5 a cross-sectional view 55 through a source/drain region of the NAND circuit with wide sheets of FIG. 3, in accordance with an embodiment of the present invention.

In FIG. 4, the PFET stack 42 includes nanosheets 42' and the NFET stack 44 includes nanosheets 44'. The nano sheets 42', 44' can also be referred to as sheets or layers. The width of the nanosheets 42', 44' can be, e.g., approximately 80 nm. The length of the nanosheets 42', 44' can be 60 nm. The PFET stack 42 and the NFET stack 44 are wide. By "wide" it is meant that each stack 42, 44 extends across most of the length of the NAND device. The wide PFET stack 42 extends over most of the wide NFET stack 44. Stated differently, the wide NFET stack 44 extends under most of the PFET stack 42.

In FIG. 5, the PFET stack 42 includes nanosheets 42' and the NFET stack 44 includes nanosheets 44'. As noted above, the width of the nanosheets 42', 44' can be, e.g., approximately 80 nm. The length of the nanosheets 42', 44' can be 60 nm. The PFET stack 42 and the NFET stack 44 are wide. The PFET stack 42 is connected to Vdd by the S/D contact 28, whereas the NFET stack 44 is connected to GND by the S/D contact 28'. The bottom portion is the backside power delivery network (BSPDN). The PFET stack 42 and the NFET stack 44 can be formed within a dielectric 46.

Therefore, according to FIGS. 3-5, the wide nanosheets enable much higher effective width ($W_{eff}$) for double high cells. The double high layout with wide nanosheets is almost 4× the $W_{eff}$ of a single high layout.

Figure 6:
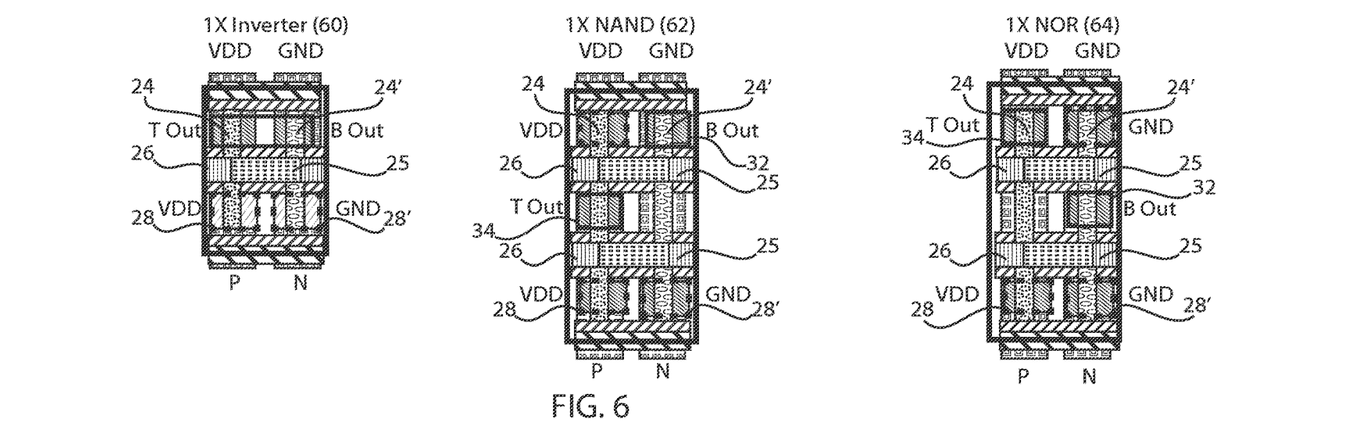
FIG. 6 is a top view of a 1X inverter circuit, a 1X NAND circuit, and a 1X NOR circuit, in accordance with an embodiment of the present invention.

FIG. 6 is a top view of a 1X inverter circuit, a 1X NAND circuit, and a 1X NOR circuit, in accordance with an embodiment of the present invention.

The 1X inverter circuit 60 depicts the PFET stack 24 that is vertically offset from the NFET stack 24'. Backside contacts 28, 28' are further illustrated. The backside contacts 28, 28' are also referred to as S/D contacts 28, 28'. S/D contact 28 connects to the PFET stack 24, whereas S/D contact 28' connects to the NFET stack 24'. The gate contact 25 is also visible over the gate 26, the gate 26 extending over both the PFET stack 24 and the NFET stack 24'. The backside output (B OUT) and the front side output (T OUT) are further shown.

The 1X NAND circuit 62 depicts the PFET stack 24 that is vertically offset from the NFET stack 24'. Backside contacts 28, 28' are further illustrated. The backside contacts 28, 28' are also referred to as S/D contacts 28, 28'. S/D contact 28 connects to the PFET stack 24, whereas S/D contact 28' connects to the NFET stack 24'. Gate contacts 25 are also visible over gates 26, the gates 26 extending over both the PFET stack 24 and the NFET stack 24'. The backside output (B OUT) 32 is shown over the NFET stack 24' (top right) and the front side output (T OUT) 34 is shown over the PFET stack 24 (middle left).

The 1X NOR circuit 64 depicts the PFET stack 24 that is vertically offset from the NFET stack 24'. Backside contacts 28, 28' are further illustrated. The backside contacts 28, 28' are also referred to as S/D contacts 28, 28'. S/D contact 28 connects to the PFET stack 24, whereas S/D contact 28' connects to the NFET stack 24'. Gate contacts 25 are also visible over gates 26, the gates 26 extending over both the PFET stack 24 and the NFET stack 24'. The backside output (B OUT) 32 is shown over the NFET stack 24' (middle right) and the front side output (T OUT) 34 is shown over the PFET stack 24 (top left).

The 1X inverter circuit 60, the 1X NAND circuit 62, and the 1X NOR circuit 64 are single high cells with narrow nanosheets.

Figure 7:
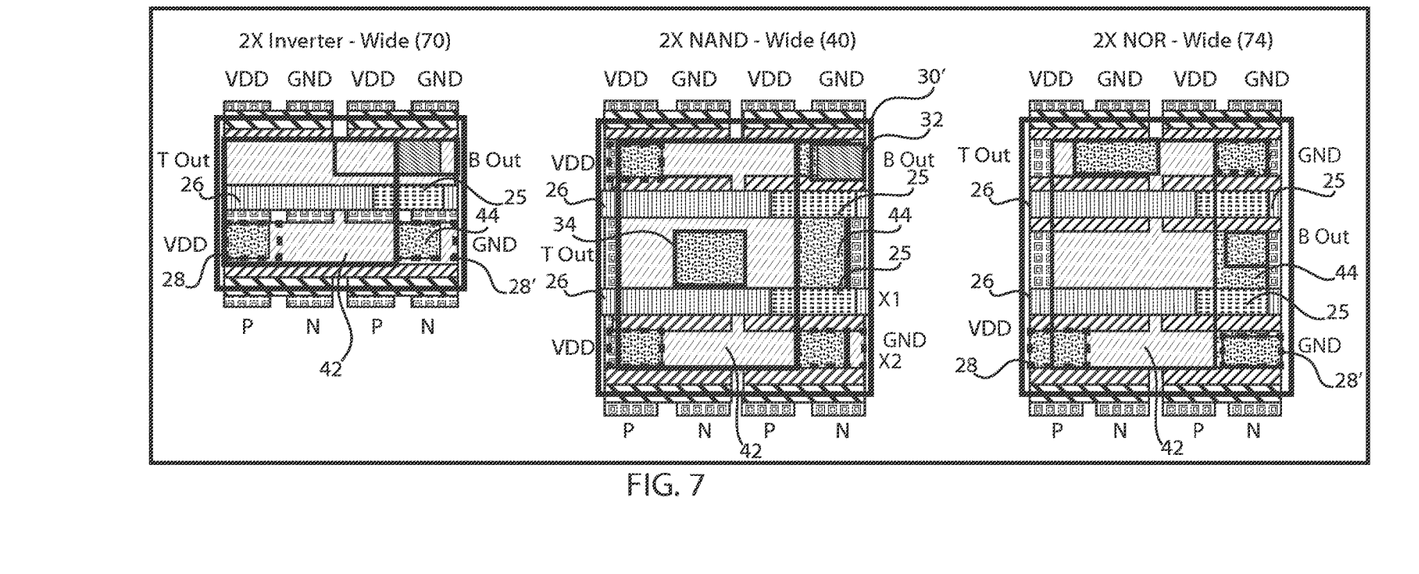
FIG. 7 is a top view of a 2X inverter circuit, a 2X NAND circuit, and a 2X NOR circuit, where all three circuits have NFETs and PFETs with wide sheets, in accordance with an embodiment of the present invention.

FIG. 7 is a top view of a 2X inverter circuit, a 2X NAND circuit, and a 2X NOR circuit, where all three circuits have NFETs and PFETs with wide sheets, in accordance with an embodiment of the present invention.

The 2X wide inverter circuit 70 depicts the PFET stack 42 and NFET stack 44. Backside contacts 28, 28' are further illustrated. The gate contact 25 is also visible over the gate 26, the gate 26 extending over both the PFET stack 42 and the NFET stack 44. The backside output (B OUT) and the front side output (T OUT) are further shown. By "wide" it is meant that each stack 42, 44 extends across most of the length of the inverter circuit 70. The wide PFET stack 42 extends over most of the wide NFET stack 44. Stated differently, the wide NFET stack 44 extends under most of the PFET stack 42.

The 2X wide NAND circuit 40 depicts the PFET stack 42 and NFET stack 44. Backside contacts 28, 28' are further illustrated. Gate contacts 25 are also visible over the gate 26, the gate 26 extending over both the PFET stack 42 and the NFET stack 44. The backside output (B OUT) 32 and the front side output (T OUT) 34 are further shown. By "wide" it is meant that each stack 42, 44 extends across most of the length of the NAND circuit 40. The wide PFET stack 42 extends over most of the wide NFET stack 44. Stated differently, the wide NFET stack 44 extends under most of the PFET stack 42.

The 2X wide NOR circuit 74 depicts the PFET stack 42 and NFET stack 44. Backside contacts 28, 28' are further illustrated. Gate contacts 25 are also visible over the gate 26, the gate 26 extending over both the PFET stack 42 and the NFET stack 44. The backside output (B OUT) 32 and the front side output (T OUT) 34 are further shown. By "wide" it is meant that each stack 42, 44 extends across most of the length of the NOR circuit 74. The wide PFET stack 42 extends over most of the wide NFET stack 44. Stated differently, the wide NFET stack 44 extends under most of the PFET stack 42.

The 2X wide inverter circuit 70, the 2X wide NAND circuit 40, and the 2X wide NOR circuit 74 are double high cells with wide nanosheets.

Therefore, in accordance with FIG. 6, a circuit (e.g., inverter, NAND, NOR) with a device edge perpendicular to a gate on a first level is offset from a device edge on a second level. Thus, the narrow sheets from a first level do not overlap with sheets from a second level.

In contrast, in accordance with FIG. 7, a circuit (e.g., inverter, NAND, NOR) with a device edge perpendicular to a gate on a first level is not offset from a device edge on a second level. Thus, the wide sheets from a first level do overlap with sheets from a second level. The overlap is between PFETs on one level with NFETs from another level (as shown in FIGS. 4 and 5). In other words, the NFET location is offset from the PFET location in a direction parallel to a gate.

The offset of the NFET location compared to the PFET location is greater than the narrow sheet width. Also, the overlap of the wide sheets is larger than a minimum narrow sheet offset. The wide sheet $W_{eff}$ is greater than 3X the narrow sheet $W_{eff}$. As a result, a lateral edge of the second plurality of nanosheet devices (70, 40, 74) extends beyond an inactive area adjacent to the first plurality of nanosheet devices (60, 62, 64). Stated differently, a lateral edge of the second plurality of nanosheet devices (70, 40, 74) of the second logic cell is vertically aligned with a lateral edge of the first plurality of nanosheet devices (60, 62, 64) of the first logic cell.

In other words, the first plurality of nanosheet devices (60, 62, 64) include nanosheets 24, 24' of a first width and the second plurality of nanosheet devices (70, 40, 74) include nanosheets 42, 44 of a second width, the second width being greater than the first width. The second width is greater than the first width by a factor of 3. For example, comparing the 1X inverter circuit 60 of FIG. 6 with the 2X wide inverter circuit 70 of FIG. 7 illustrates the width difference between 24, 24' and 42, 44. Similarly, comparing the 1X NAND circuit 62 of FIG. 6 with the 2X wide NAND circuit 40 of FIG. 7 illustrates the width difference between 24, 24' and 42, 44. Further, comparing the 1X NOR circuit 64 of FIG. 6 with the 2X wide NOR circuit 74 of FIG. 7 illustrates the width difference between 24, 24' and 42, 44.

Moreover, an overlap of an active device area of the second logic device is three times greater than an overlap on an active area of the first logic device. For example, comparing the 1X inverter circuit 60 of FIG. 6 with the 2X wide inverter circuit 70 of FIG. 7 illustrates the overlap of the active area 42 compared to the overlap of the active area 24 (about 3X times the overlap). Clearly, element 42 of the 2X wide inverter circuit 70 occupies a much greater area or space than element 24 of the 1X inverter circuit 60 (e.g., 3X). Similarly, comparing the 1X NAND circuit 62 of FIG. 6 with the 2X wide NAND circuit 40 of FIG. 7 illustrates the overlap of the active area 42 compared to the overlap of the active area 24 (about 3X times the overlap). Clearly, element 42 of the 2X wide NAND circuit 40 occupies a much greater area or space than element 24 of the 1X NAND circuit 62 (e.g., 3X). Further, comparing the 1X NOR circuit 64 of FIG. 6 with the 2X wide NOR circuit 74 of FIG. 7 illustrates the overlap of the active area 42 compared to the overlap of the active area 24 (about 3X times the overlap). Clearly, element 42 of the 2X wide NOR circuit 74 occupies a much greater area or space than element 24 of the 1X NOR circuit 64 (e.g., 3X).

The footprint for the wide sheet circuit is approximately equal to a 2X footprint for a narrow sheet circuit of the same type. Thus, one edge of the narrow sheet aligns with the edge of the wide sheet.

Thus, in one example, if the first circuit (e.g., inverter, NAND, NOR) has a height X, width Y, and $W_{eff}$ Z, then the second circuit (e.g., inverter, NAND, NOR) has a height 2X, width Y, and $W_{eff} > 3Z$.

In another example, if the first circuit (e.g., inverter, NAND, NOR) has a height X, width Y, and $W_{eff}$ Z, then the second circuit (e.g., inverter, NAND, NOR) has a height 2X, width Y, and $W_{eff} > 2.5Z$.

Figure 8:
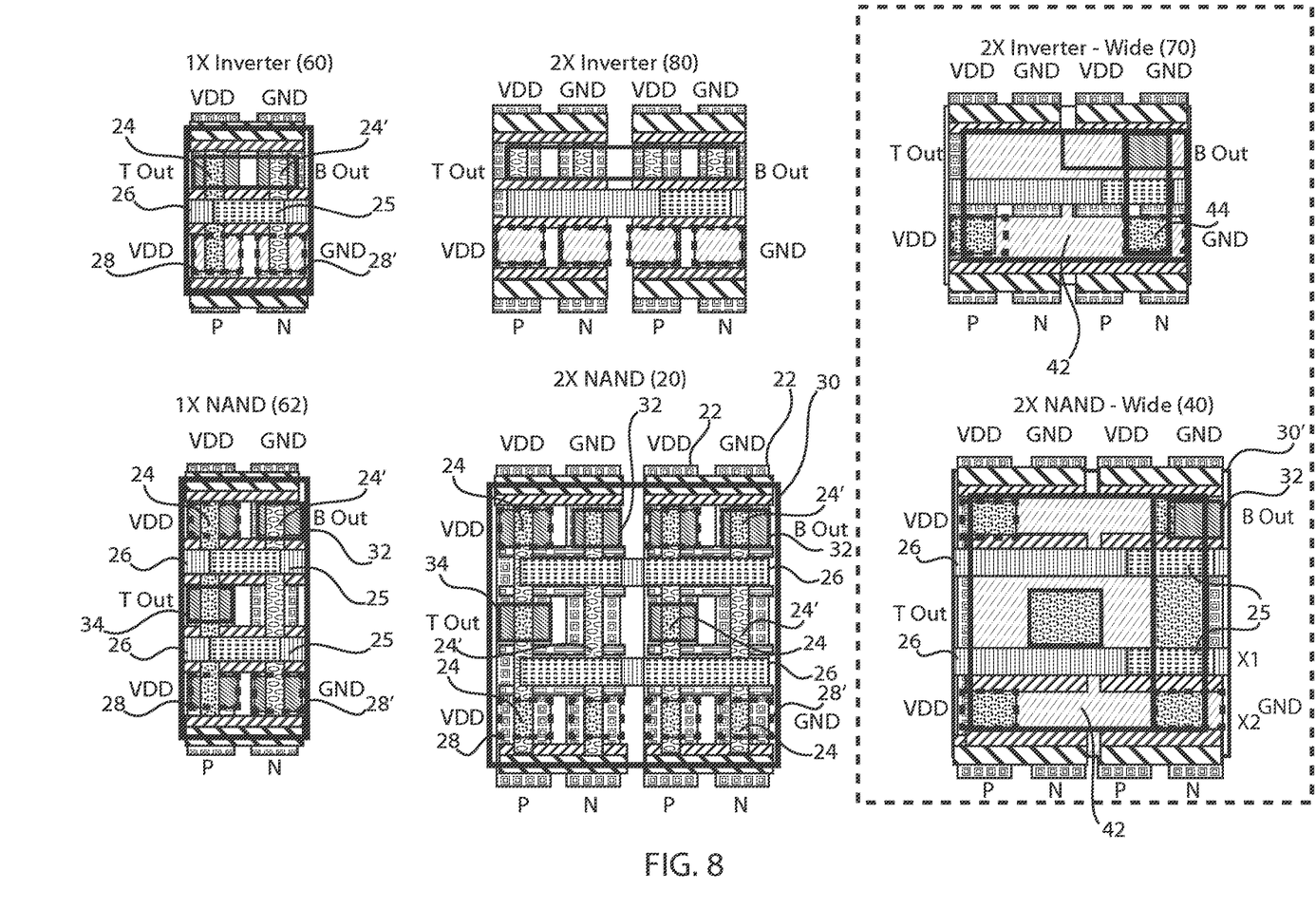
FIG. 8 illustrates top views of a 1X inverter circuit, a 2X inverter circuit, and a 2X inverter circuit with wide sheets, and a 1X NAND circuit, a 2X NAND circuit, and a 2X NAND circuit with wide sheets, in accordance with an embodiment of the present invention.

FIG. 8 illustrates top views of a 1X inverter circuit 60, a 2X inverter circuit 80, and a 2X inverter circuit with wide sheets 70, and a 1X NAND circuit 62, a 2X NAND circuit 20, and a 2X NAND circuit with wide sheets 40, in accordance with an embodiment of the present invention.

The top region of FIG. 8 illustrates the 1X inverter circuit 60, the 2X inverter circuit 80, and the 2X wide inverter circuit 70. The bottom region of FIG. 8 illustrates the 1X NAND circuit 62, the 2X NAND circuit 20, and the 2X wide NAND circuit 40.

In the exemplary embodiments of FIGS. 2-8, the device or cell includes a top NS and a bottom NS. However, in an alternative embodiment, the top layer can be a NS and the bottom layer can be a FinFET, or vice versa. In another alternative embodiment, the top and bottom layers can be FinFETs. One skilled in the art can contemplate using any type of combination of transistors.

Figure 9:
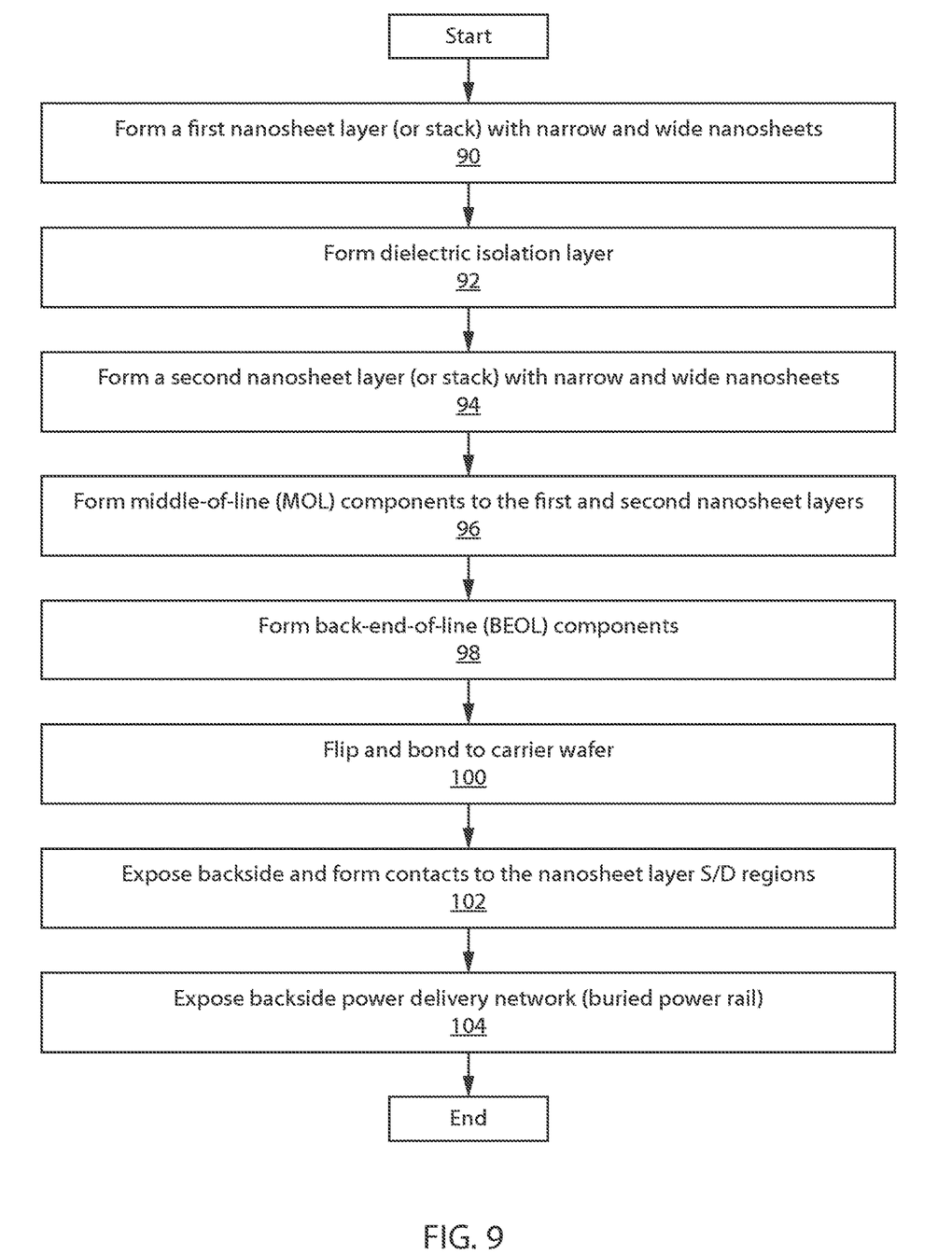
FIG. 9 is a block/flow diagram of an exemplary method for constructing staggered stack circuits with increased effective width, in accordance with an embodiment of the present invention.

FIG. 9 is a block/flow diagram of an exemplary method for constructing staggered stack circuits with increased effective width, in accordance with an embodiment of the present invention.

At block 90, construct a first nanosheet layer (or device) with narrow and wide nanosheets.

At block 92, form a dielectric isolation layer.

At block 94, construct a second nanosheet layer (or device) with narrow and wide nanosheets.

At block 96, form middle-of-line (MOL) components to the first and second nanosheet layers (or devices).

At block 98, form back-end-of-line (BEOL) components.

At block 100, flip and bond to a carrier wafer.

At block 102, expose the backside and form contacts to the nanosheet device S/D regions.

At block 104, form a backside power delivery network (e.g., buried power rail).

In an alternative embodiment, the first nanosheet device is constructed, the wafer is then flipped, and then the second nanosheet device is constructed.

In another alternative embodiment, a nanosheet is constructed on a bottom layer and a FinFET is formed on a top layer.

In yet another alternative embodiment, a FinFET is formed on both the bottom and top layers.

In conclusion, the exemplary embodiments of the present invention introduce a staggered stacked device with two circuits of the same type with at least a first circuit utilizing narrow device width and at least a second circuit utilizing wide device width. The active device area on the narrow device circuit does not overlap between levels. In contrast, the active device area on the wide device circuit does overlap between levels. Stated differently, the exemplary embodiments of the present invention introduce a stacked device circuit with at least two device layers, including two circuits of the same type with one circuit utilizing a narrow device width (FIG. 6) and a second circuit utilizing a wide device width (FIG. 7). The overlap of active device area on the wide device circuit is at least 3X the overlap on the narrow device circuit. Further, the area of the wide device circuit is approximately equal to 2X the area of the narrow device circuit. As a result, if the first logic cell has a height X, a width Y, and an effective width ($W_{eff}$) Z, then the second logic cell has a height 2X, a width Y, and $W_{eff} > 2.5$ Z (or $W_{eff} > 3$ Z).

It is to be understood that the present invention will be described in terms of a given illustrative architecture.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method and structure for constructing staggered stacked circuits with increased effective width (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor structure comprising:
a first logic cell having a first plurality of nanosheet devices along an axis; and
a second logic cell having a second plurality of nanosheet devices along the axis, wherein nanosheets of the second plurality of nanosheet devices are wider than nanosheets of the first plurality of nanosheet devices; and wherein, when the first logic cell has a height X, a width Y, and an effective width ($W_{eff}$) Z, then the second logic cell has a height 2X, a width Y, and $W_{eff} > 2.5$ Z.

2. The semiconductor structure of claim 1, wherein the first logic cell is a same type as the second logic cell.

3. The semiconductor structure of claim 2, wherein the first and second logic cells include inverter circuits.

4. The semiconductor structure of claim 2, wherein the first and second logic cells include NAND circuits.

5. The semiconductor structure of claim 2, wherein the first and second logic cells include NOR circuits.

6. The semiconductor structure of claim 1, wherein a lateral edge of the second plurality of nanosheet devices extends beyond an inactive area adjacent to the first plurality of nanosheet devices.

7. The semiconductor structure of claim 1, wherein an overlap of an active device area of the second logic cell is three times greater than an overlap of an active area of the first logic cell.

8. The semiconductor structure of claim 1, wherein the nanosheets of the first plurality of nanosheet devices of the first logic cell at a first level are vertically offset from the nanosheets of the first plurality of nanosheet devices of the first logic cell at a second level to prevent overlap.

9. The semiconductor structure of claim 1, wherein the nanosheets of the second plurality of nanosheet devices of the second logic cell at a first level overlap with a portion of the nanosheets of the second plurality of nanosheet devices of the second logic cell at a second level.

10. The semiconductor structure of claim 1, wherein a footprint of the second logic cell is approximately equal to two times a footprint of the first logic cell.

11. The semiconductor structure of claim 1, wherein a lateral edge of the second plurality of nanosheet devices of the second logic cell is vertically aligned with a lateral edge of the first plurality of nano sheet devices of the first logic cell.

12. A semiconductor structure comprising:
a first logic cell having a first plurality of nanosheet devices along a first axis and a second axis, wherein the first and second axes are substantially parallel to each other; and
a second logic cell having a second plurality of nanosheet devices along the first axis,
wherein nanosheets of the second plurality of nanosheet devices are wider than nanosheets of the first plurality of nanosheet devices; and
wherein, when the first logic cell has a height X, a width Y, and an effective width ($W_{eff}$) Z, then the second logic cell has a height 2X, a width Y, and $W_{eff} > 2.5$ Z.

13. The semiconductor structure of claim 12, wherein a lateral edge of the second plurality of nanosheet devices extends to the second axis.

14. The semiconductor structure of claim 12, wherein the first logic cell is a same type as the second logic cell.

15. The semiconductor structure of claim 14, wherein the first and second logic cells include inverter circuits.

16. The semiconductor structure of claim 14, wherein the first and second logic cells include NAND circuits.

17. The semiconductor structure of claim 14, wherein the first and second logic cells include NOR circuits.

18. The semiconductor structure of claim 12, wherein an overlap of an active device area of the second logic cell is three times greater than an overlap of an active area of the first logic cell.

19. The semiconductor structure of claim 12, wherein a footprint of the second logic cell is approximately equal to two times a footprint of the first logic cell.

20. A method comprising:
constructing a first nanosheet device with narrow and wide nanosheets;
forming a dielectric isolation layer;
constructing a second nanosheet device with narrow and wide nanosheets;
forming middle-of-line (MOL) components to the first and second nanosheet devices;
forming back-end-of-line (BEOL) components;
flipping and bonding to a carrier wafer;
exposing a backside and forming contacts to the source/drain regions; and
forming a backside power delivery network.

* * * * *